(12) United States Patent
Shin

(10) Patent No.: US 7,521,988 B2
(45) Date of Patent: Apr. 21, 2009

(54) VOLTAGE BOOSTER FOR SEMICONDUCTOR DEVICE AND SEMICONDUCTOR MEMORY DEVICE USING SAME

(75) Inventor: Chang-Ho Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/730,651

(22) Filed: Apr. 3, 2007

(65) Prior Publication Data
US 2008/0018381 A1    Jan. 24, 2008

(30) Foreign Application Priority Data
Jul. 18, 2006    (KR) .................. 10-2006-0067040

(51) Int. Cl.
  *G05F 1/10*    (2006.01)
  *G05F 3/02*    (2006.01)
(52) U.S. Cl. ................ 327/536; 327/537; 363/59; 363/60
(58) Field of Classification Search ............ 327/536, 327/537; 363/59, 60
See application file for complete search history.

(56) References Cited

U.S. PATENT DOCUMENTS

| | | | |
|---|---|---|---|
| 5,652,730 A | 7/1997 | Kono et al. | |
| 6,492,850 B2 | 12/2002 | Kato et al. | |
| 6,762,639 B2 * | 7/2004 | Ito et al. | 327/536 |
| 7,042,275 B2 * | 5/2006 | Suwa et al. | 327/536 |
| 7,081,776 B2 * | 7/2006 | Kato et al. | 327/77 |
| 7,176,748 B2 * | 2/2007 | Khouri et al. | 327/536 |
| 7,355,468 B2 * | 4/2008 | de Ambroggi et al. | 327/536 |
| 7,358,794 B2 * | 4/2008 | Kawagoshi | 327/537 |
| 7,446,595 B2 * | 11/2008 | Lee et al. | 327/536 |
| 2005/0141319 A1 | 6/2005 | Jang | |
| 2007/0296486 A1 * | 12/2007 | Ambroggi et al. | 327/536 |
| 2008/0116960 A1 * | 5/2008 | Nakamura | 327/536 |

FOREIGN PATENT DOCUMENTS

| KR | 1019970072688 A | 11/1997 |
|---|---|---|
| KR | 1020040024794 A | 3/2004 |

* cited by examiner

*Primary Examiner*—Lincoln Donovan
*Assistant Examiner*—Adam Houston
(74) *Attorney, Agent, or Firm*—Volentine & Whitt, PLLC

(57) ABSTRACT

A semiconductor device has a power-saving mode and a normal mode. A voltage booster within the semiconductor device responds to the normal mode and the power-saving mode by controlling various internal operating voltages of the semiconductor device using a level shifter, an internal voltage booster, and a voltage boosting circuit. The initial voltage booster is configured to transmit an external power supply voltage through an initial boosting node to a voltage boosting terminal in response to the level shifter output signal during the normal mode, and to block transmission of the external power supply voltage to the initial boosting node to decrease a voltage level of the initial boosting node during the power-saving mode.

11 Claims, 8 Drawing Sheets

VOLTAGE BOOSTER FOR SEMICONDUCTOR DEVICE AND SEMICONDUCTOR MEMORY DEVICE USING SAME

BACKGROUND OF THE INVENTION

1. Field of the Invention

Embodiments of the invention relate generally to a voltage booster for a semiconductor device. More particularly, embodiments of the invention relate to a voltage booster and associated initial voltage boosting circuit adapted for use in a semiconductor device having a power-saving mode.

A claim of priority is made to Korean Patent Application No. 2006-0067040 filed on Jul. 18, 2006, the disclosure of which is hereby incorporated by reference in its entirety.

2. Description of Related Art

Modern semiconductor devices tend to operate using relatively low internal operating voltages. The relatively low internal operating voltages are typically generated by applying a relatively high external power supply voltage to the semiconductor devices and then stepping down the relatively high external power supply voltage. Initial application of an external power supply voltage to a semiconductor device and subsequent generation of internal operating voltage(s) is commonly referred to as a "power-up" operation of the semiconductor device. In the power-up operation, the semiconductor device will not typically begin to operate immediately after the external power supply voltage is initially applied to the semiconductor device. Instead, the semiconductor device typically first goes through a process of stabilization of the internal operating voltages. In general, this stabilization process is carried out using an initial voltage boosting circuit, which is a type of stabilization circuit.

In addition, certain types of semiconductor devices also use internal operating voltages that are higher than the external power supply voltage. For example, a boosting voltage Vpp higher than an external power supply voltage VDD may be used to access memory cells in a dynamic random access memory (DRAM). In the DRAM, circuits such as a word line driver circuit, a bit line isolation circuit, and a data output buffer circuit may use boosting voltage Vpp. Where semiconductor devices use a boosting voltage, the power-up operation generally further includes operations for boosting the external power supply voltage.

One reason why semiconductor devices may use internal operating voltages higher than the external power supply voltage is because the operation of some features in the device may require relatively high voltages compared with other features. For example, memory cell transistors in a DRAM may have higher threshold voltages than other transistors in the DRAM due to a relatively small size of the memory cell transistors. Accordingly, a word line driver circuit may apply the boosting voltage to word lines in the DRAM in order to access the memory cell transistors in the DRAM.

In general, the operation of a semiconductor device is unreliable until the internal operating voltages stabilize during some period of time after the external power supply voltage is applied to the semiconductor device. Accordingly, to monitor the stabilization of the internal operating voltages, the semiconductor device may generate a power-up signal /PWRUP indicating whether an internal power supply voltage has reached a predetermined internal power supply voltage target level. Once the internal operating voltages stabilize, control signals required for operation of the semiconductor device may be effectively controlled.

Where the internal power supply voltage has not yet reached the predetermined internal power supply voltage target level, power-up signal /PWRUP increases in response to the external power supply voltage. Then, once the internal power supply voltage reaches the predetermined internal power supply voltage target level, power-up signal /PWRUP transitions to a logic level "low", indicating that the internal power supply voltage is above the predetermined internal power supply voltage target level and therefore the internal operating voltages of the semiconductor device have stabilized.

FIG. 1 is a circuit diagram of a conventional initial voltage boosting circuit for a semiconductor device. The initial voltage boosting circuit receives power-up signal /PWRUP and increases a voltage level apparent on a voltage boosting terminal VPP based on a logic level of power up signal /PWRUP.

Referring to FIG. 1, the initial voltage boosting circuit comprises a level shifter 10, an initial voltage booster 20, and a first inverter INV1. Level shifter 10 comprises first through fourth negative metal-oxide semiconductor (NMOS) transistors N1 through N4, first and second positive metal-oxide semiconductor (PMOS) transistors P1 and P2, and a second inverter INV2. Initial voltage booster 20 includes a third PMOS transistor P3.

In level shifter 10, first PMOS transistor P1 has a first terminal receiving boosting voltage Vpp, a second terminal, and a gate. Second PMOS transistor P2 has a first terminal receiving boosting voltage Vpp, a second terminal connected to the gate of first PMOS transistor P1, and a gate connected to the second terminal of first PMOS transistor P1. First NMOS transistor N1 has a first terminal connected to the second terminal of first PMOS transistor P1 through a first node No1, a second terminal, and a gate receiving external power supply voltage VDD. Second NMOS transistor N2 has a first terminal connected to the second terminal of first NMOS transistor N1, a second terminal connected to ground, and a gate. Third NMOS transistor N3 has a first terminal connected to the second terminal of second PMOS transistor P2 through a second node No2, a second terminal, and a gate receiving external power supply voltage VDD. Fourth NMOS transistor N4 has a first terminal connected to the second terminal of third NMOS transistor N3, a second terminal connected to ground, and a gate. Second inverter INV2 has an input terminal connected to the gate of second NMOS transistor N2 and an output terminal connected to the gate of fourth NMOS transistor N4. Second node No2 is connected to a level shifter output terminal LS_OUT.

First inverter INV1 has an input terminal receiving power-up signal /PWRUP, and an output terminal connected to the gate of second NMOS transistor N2. First inverter outputs an inverted power-up signal /PWRUP on its output terminal.

In initial voltage booster 20, third PMOS P3 transistor has a first terminal and a bulk receiving boosting voltage Vpp from a voltage boosting circuit (not shown), a second terminal connected to external power supply voltage VDD, and a gate connected to level shifter output terminal LS_OUT.

The operation of the initial voltage boosting circuit of FIG. 1 will now be described in further detail.

Since first and third NMOS transistors N1 and N3 both have gates connected to external power supply voltage VDD, first and third NMOS transistors N1 and N3 are turned on. Where power-up signal /PWRUP has a logic level "low", second NMOS transistor N2 is turned on, and fourth NMOS transistor N4 is turned off. Thus, node No1 assumes ground voltage VSS and second PMOS transistor P2 is turned on. As a result, node No2 receives boosting voltage Vpp, turning off first PMOS transistor P1. Since node No2 receives boosting voltage Vpp, boosting voltage Vpp is output on level shifter output terminal LS_OUT.

Under these conditions, boosting voltage Vpp is applied to the gate of third PMOS transistor P3 in initial voltage booster 20, turning off third PMOS transistor P3. As a result, external power supply voltage VDD is not connected to voltage boosting terminal VPP and initial voltage booster 20 does not generate an initial boosting voltage Vp in response to a rise in external power supply voltage VDD. Instead, the voltage boosting circuit performs a charge pumping operation and generates boosting voltage Vpp at a predetermined target voltage level.

Where power-up signal /PWRUP has a logic level "high", second NMOS transistor N2 is turned off and fourth NMOS transistor N4 is turned on. Accordingly, node No2 assumes ground voltage VSS and first PMOS transistor P1 is turned on. As a result, node No1 receives boosting voltage Vpp and second PMOS transistor P2 is turned off. Since node No2 is at voltage VSS, ground voltage VSS is output on level shifter output terminal LS_OUT Under these conditions, ground voltage VSS is applied to the gate of PMOS transistor P3, turning on PMOS transistor P3. As a result, external power supply voltage VDD is connected to voltage boosting terminal VPP so that initial voltage booster 20 generates initial boosting voltage Vp in response to a rise in external power supply voltage VDD.

FIG. 2 is a voltage diagram illustrating an increase in boosting voltage Vpp over time and a charge pumping period in the initial voltage boosting circuit illustrated in FIG. 1. In FIG. 2, time is plotted on the x-axis and voltage is plotted on the y-axis. A text label "VEXT" denotes a waveform of external power supply voltage VDD applied to internal circuits of the semiconductor device of FIG. 1 during a normal power-on operation. A text label "VINT" denotes a waveform of an internal power supply voltage VINT applied to the internal circuits. A text label "/PWRUP" denotes a waveform of power-up signal /PWRUP used to indicate when internal power supply voltage VINT is above the predetermined internal power supply voltage target level. A text label "VPP" denotes a waveform of boosting voltage Vpp generated by performing a boosting operation and a pumping operation in response to power-up signal /PWRUP.

In FIG. 2, a first period is delimited by an initial time point when external power supply voltage VDD is first applied to internal circuits of the semiconductor device, and a first time point T1 when internal power supply voltage VINT reaches the predetermined internal power supply voltage target level. During the first period, external power supply voltage VDD increases from 0V, internal power supply voltage VINT increases in response to the increase of external power supply voltage VDD, and power-up signal /PWRUP increases along with the increase in internal power supply voltage VINT.

At time point T1, when internal power supply voltage VINT reaches the predetermined internal power supply voltage target level, power-up signal /PWRUP transitions to logic level "low" to enable a charge pumping operation. The charge pumping operation is performed after time point T1 to elevate the level of boosting voltage Vpp. Accordingly, a second period following time point T1 will be referred to as a "boosting voltage pumping operation period".

As described above, boosting voltage Vpp with a voltage level higher than a voltage level of external power supply voltage VDD can be used as an internal operating voltage for a semiconductor device, e.g., for turning on memory cell transistors in a DRAM via word lines. In order to generate boosting voltage Vpp as illustrated in FIG. 2, boosting voltage Vpp is first increased by a boosting operation in the first period and then further increased by a charge pumping operation in the second period.

Some semiconductor devices use a power-saving mode to conserve power. For example, the power-saving mode can play an important role in semiconductor devices included in portable electronic devices since limited power (e.g., battery life) tends to play an important role in the utility of such portable devices. The power-saving mode is typically enabled in response to a power-saving mode enable signal.

In the power-saving mode, internal power supply voltage VINT is intentionally decreased to conserve power. As an example, in the power-saving mode, internal power supply voltage VINT and boosting voltage Vpp of FIG. 1 may decrease. In the example of FIG. 1, absent the power-saving mode, the amplitude of boosting voltage Vpp exceeds the amplitude of external power supply voltage VDD and the threshold voltage of various transistors in the semiconductor device. However, where boosting voltage Vpp decreases, the amplitude of boosting voltage Vpp may fall below the amplitude of external power supply voltage VDD and the threshold voltage of the transistors in the semiconductor device. More particularly, in the example of FIG. 1, the amplitude of boosting voltage Vpp may fall below the threshold voltage of third PMOS transistor P3. Where this happens, third PMOS transistor P3 may be undesirably turned on.

SUMMARY OF THE INVENTION

According to one embodiment of the invention, a voltage booster for a semiconductor device having a normal mode and a power-saving mode comprises a level shifter, an initial voltage booster, and a voltage boosting circuit. The level shifter is configured to receive a power-up signal and generate a level shifter output signal in response to the power-up signal, wherein the power-up signal increases along with an internal power supply voltage generated using an external power supply voltage and makes a logical transition when the internal power supply voltage reaches an predetermined internal power supply voltage target level. The initial voltage booster is configured to transmit the external power supply voltage through an initial boosting node to a voltage boosting terminal in response to the level shifter output signal during the normal mode, and to block transmission of the external power supply voltage to the initial boosting node to decrease a voltage level of the initial boosting node during the power-saving mode. The voltage boosting circuit is configured to perform a charge pumping operation in response to the power-up signal to generate a boosting voltage with an amplitude higher than an amplitude of the external power supply voltage during the normal mode and further configured to disable the charge pumping operation during the power-saving mode.

According to another embodiment of the invention, a semiconductor memory device having a normal mode and a power-saving mode comprises a power-up circuit, an initial voltage boosting circuit, and a voltage boosting circuit. The power-up circuit is configured to output a power-up signal, wherein the power-up signal increases along with an internal power supply voltage generated using an external power supply voltage and makes a logical transition when the internal power supply voltage reaches an internal power supply voltage target level. The initial voltage boosting circuit is configured to receive the power-up signal and generate a level shifter output signal with a logic level based on a logic level of the power-up signal, transmit the external power supply voltage from an initial boosting node to a voltage boosting terminal in response to the level shifter output signal during a normal mode, and block transmission of the external power supply voltage to the initial boosting node to decrease a voltage level of the initial boosting node during a power-saving mode. The voltage boosting circuit is configured to perform a charge pumping operation in response to a logic level of the power-up signal during the normal mode to generate a boosting voltage with an amplitude higher than an amplitude of the external power supply voltage and further configured to disable the charge pumping operation during the power-saving mode.

BRIEF DESCRIPTION OF THE DRAWINGS

Exemplary embodiments of the invention are described below in relation to the accompanying drawings. Throughout the drawings like reference numbers indicate like exemplary elements, components, and steps. In addition, the drawings are not necessarily drawn to scale, with emphasis instead being placed on providing clear explanations of the exemplary embodiments. In the drawings.

DESCRIPTION OF EXEMPLARY EMBODIMENTS

Exemplary embodiments of the invention are described below with reference to the corresponding drawings. These embodiments are presented as teaching examples and the actual scope of the invention is defined by the claims that follow. In general, various embodiments of the invention described below provide voltage boosters and semiconductor memory devices using the voltage boosters.

Figure 3:
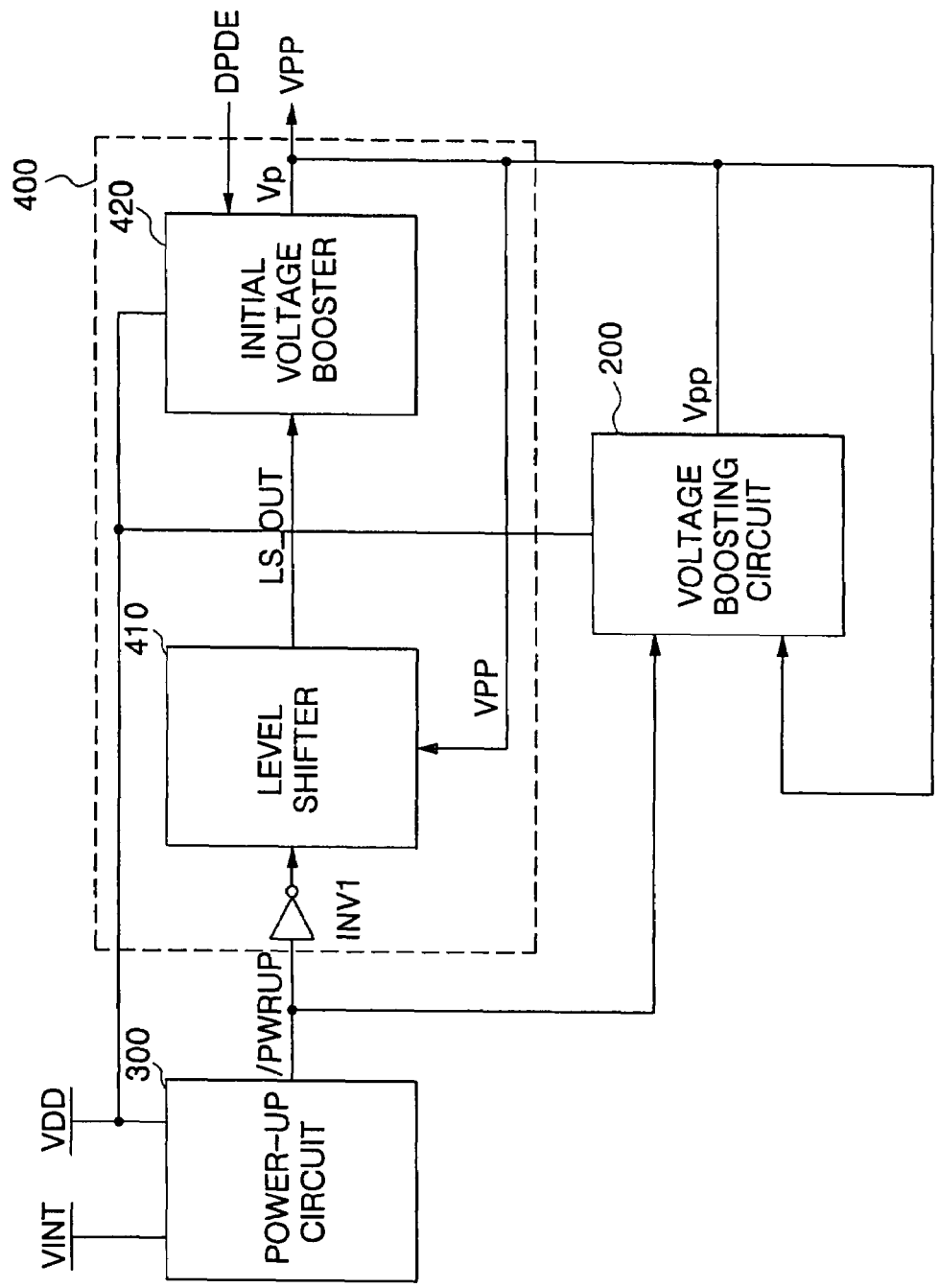
FIG. 3 is a block diagram of a voltage booster for a semiconductor device according to an exemplary embodiment of the invention.

FIG. 3 is a block diagram of a voltage booster for a semiconductor device according to one embodiment of the invention. Referring to FIG. 3, the voltage booster comprises a voltage boosting circuit 200, a power-up circuit 300, and an initial voltage boosting circuit 400. Initial voltage boosting circuit 400 comprises a level shifter 410 and an initial voltage booster 420.

Voltage boosting circuit 200 receives power-up signal /PWRUP from power-up circuit 300, and a fed-back boosting voltage Vpp, and outputs boosting voltage Vpp. Where power-up signal /PWRUP has logic level "low, voltage boosting circuit 200 compares fed-back boosting voltage Vpp with a predetermined reference voltage and detects whether fed-back boosting voltage Vpp exceeds a boosting voltage target level based on the comparison. Where fed-back boosting voltage Vpp is less than the boosting voltage target level, voltage boosting circuit 200 periodically generates an internal pulse signal, producing charges to increase the amplitude of boosting voltage Vpp until it reaches the reference voltage. Boosting voltage Vpp remains at or above the boosting voltage target level while the semiconductor is in a normal operating mode.

Power-up circuit 300 receives external power supply voltage VDD and internal power supply voltage VINT and outputs power-up signal /PWRUP. During a power-up operation, power-up signal /PWRUP rises along with internal power supply voltage VINT and then transitions to logic level "low" after internal power supply voltage VINT reaches a predetermined internal power supply voltage target level.

Initial voltage boosting circuit 400 receives external power supply voltage VDD, power-up signal /PWRUP, and boosting voltage Vpp, and generates initial boosting voltage Vp. In addition, initial voltage boosting circuit 400 also receives power-saving mode enable signal DPDE used to control a power-saving mode of the semiconductor device. Initial voltage boosting circuit 400 controls a connection of external power supply voltage VDD to a voltage boosting terminal VPP. Where the semiconductor device is not in the power-saving mode, initial voltage boosting circuit 400 outputs initial boosting voltage Vp with an amplitude substantially equal to external power supply voltage VDD. On the other hand, where the semiconductor device is in the power-saving mode, initial voltage boosting circuit 400 disconnects external power supply voltage VDD from voltage boosting terminal VPP and outputs boosting voltage Vpp with a power-saving boosting voltage level.

To enter the power-saving mode from the normal operating mode, power-saving mode enable signal DPDE transitions from logic level "low" to logic level "high". In response to this transition of power-saving mode enable signal DPDE, internal power supply voltage VINT decreases. Once internal power supply voltage VINT falls below the internal power supply voltage target level, power-up signal /PWRUP transitions from logic level "low" to logic level "high" and then decreases along with internal power supply voltage VINT.

Power-up signal /PWRUP will again rise, together with internal power supply voltage VINT after power-saving mode enable signal DPDE transitions from logic level "high" back to logic level "low". Then, once internal power supply voltage VINT again reaches the internal power supply voltage target voltage, power-up signal /PWRUP again transitions to logic level "low" and the semiconductor device may eventually assume the normal operating mode once again.

Figure 5:
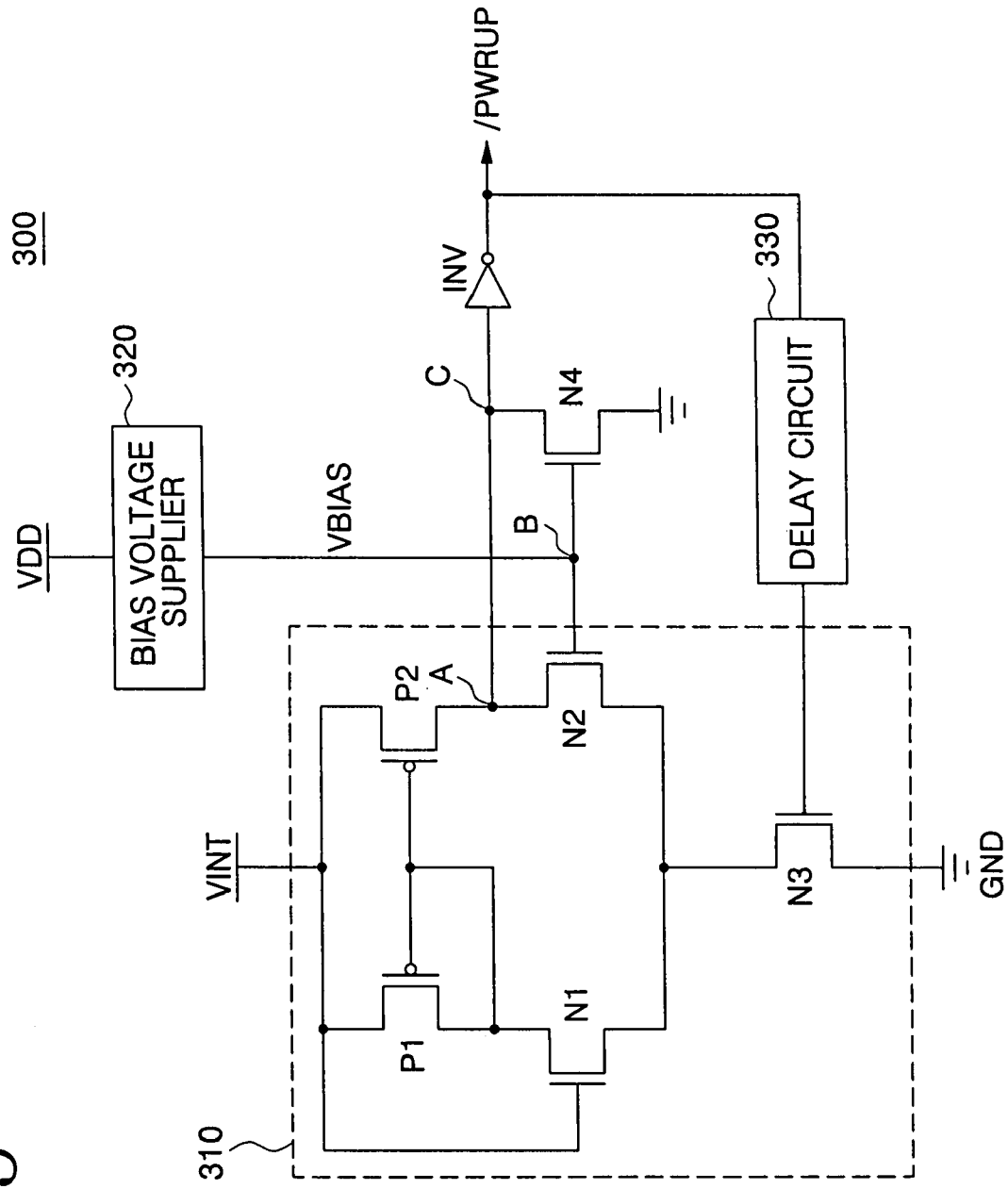
FIG. 5 is a circuit diagram illustrating one embodiment of a power-up circuit in the voltage booster of FIG. 3.
Figure 6:
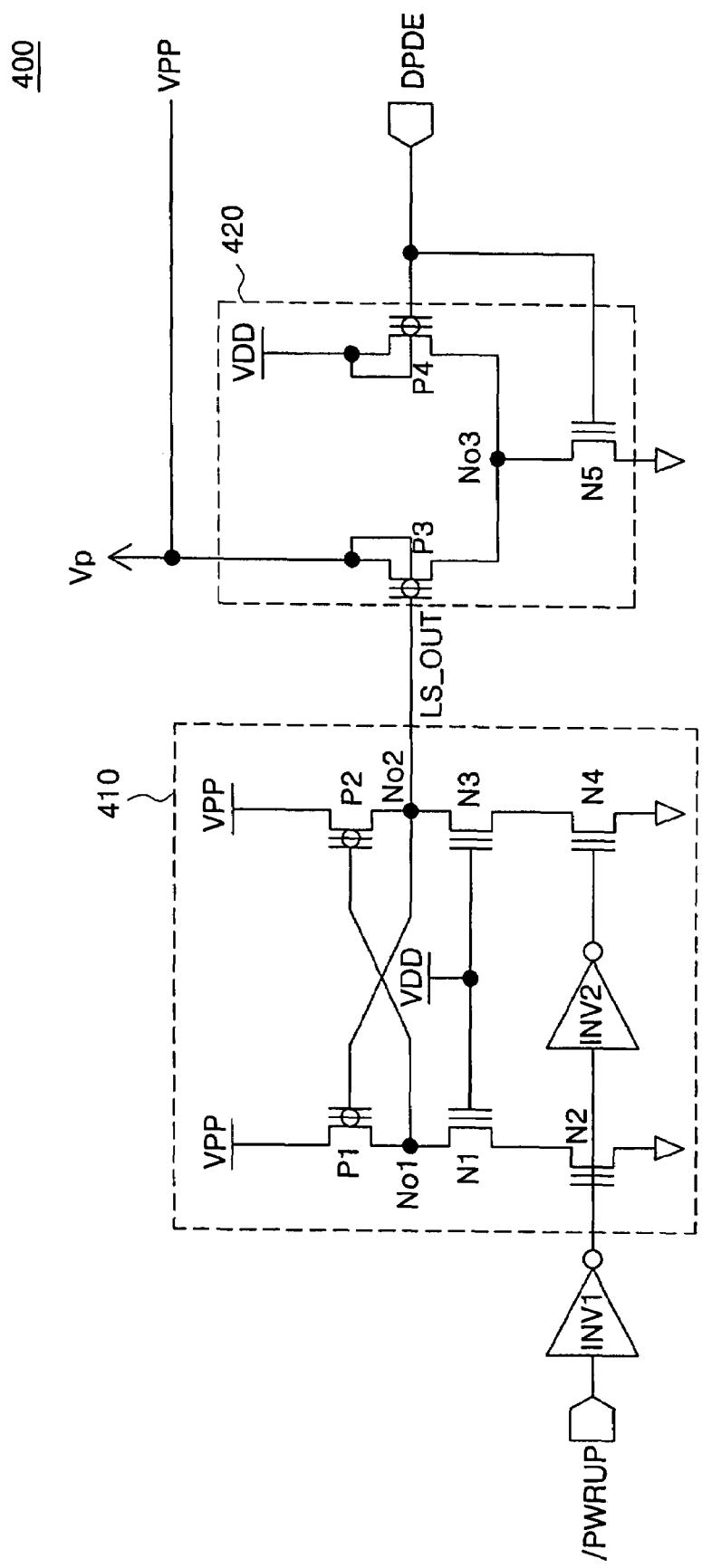
FIG. 6 is a circuit diagram illustrating one embodiment of an initial voltage booster in the voltage booster of FIG. 3.

The operation of voltage boosting circuit 200, power up circuit 300, and initial voltage boosting circuit are described in further detail below with respect to FIGS. 4, 5, and 6, respectively. In particular, FIG. 4 is a block diagram illustrating one embodiment of voltage boosting circuit 200, FIG. 5 is a circuit diagram illustrating one embodiment of power-up circuit 300, and FIG. 6 is a circuit diagram illustrating one exemplary embodiment of initial voltage boosting circuit 400 shown in FIG. 3.

Figure 4:
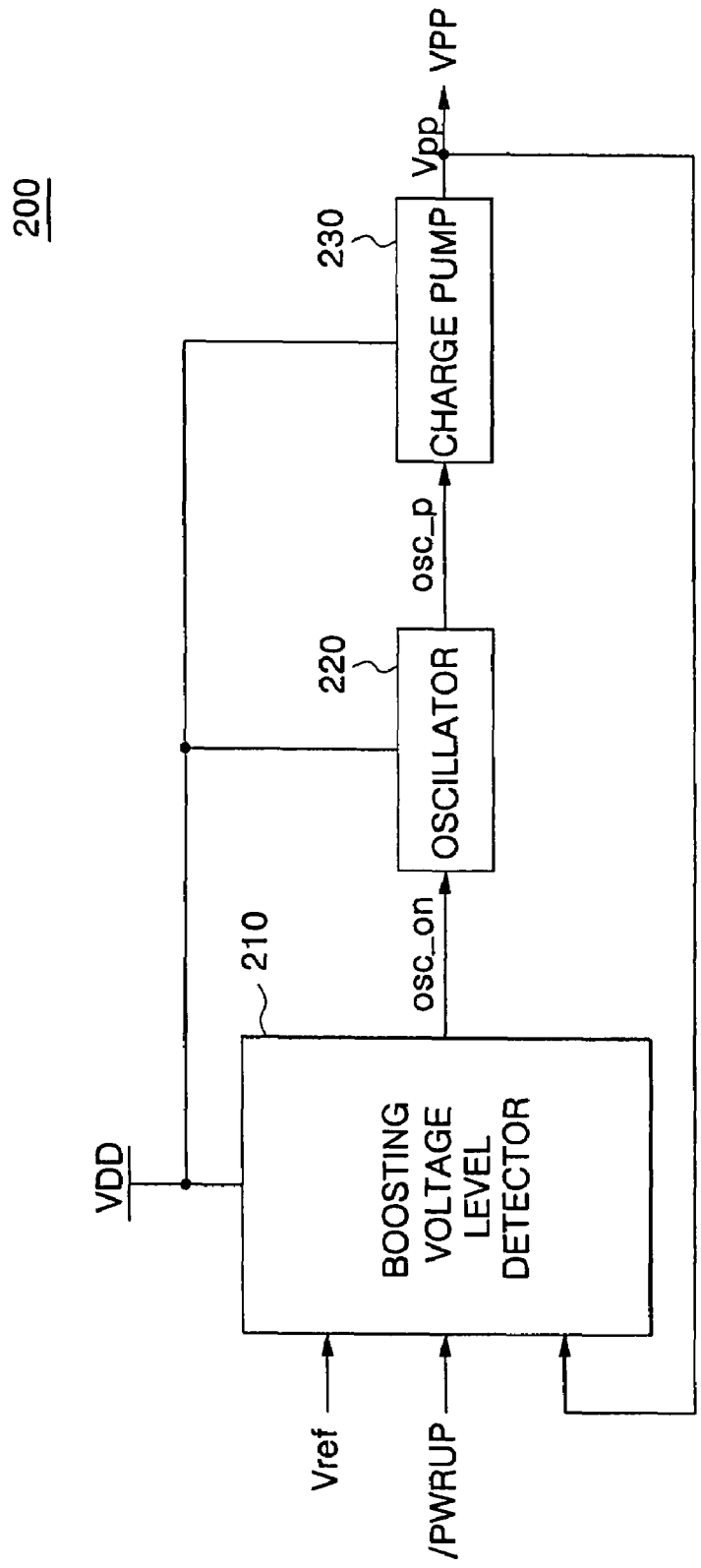
FIG. 4 is a block diagram illustrating one embodiment of a voltage boosting circuit in the voltage booster of FIG. 3.

Referring to FIG. 4, in one embodiment, voltage boosting circuit 200 comprises a boosting voltage level detector 210, an oscillator 220, and a charge pump 230.

Boosting voltage level detector 210 receives power-up signal /PWRUP from power-up circuit 300, a reference voltage Vref from a reference voltage generator (not shown), external power supply voltage VDD from a power source, and fed-back boosting voltage Vpp. Boosting voltage level detector 210 compares fed-back boosting voltage Vpp with reference voltage Vref to determine whether boosting voltage Vpp is greater than or equal to a boosting voltage target level. Boosting voltage level detector 210 outputs an oscillator-on signal osc_on for controlling oscillator 220 based on the comparison between fed-back boosting voltage Vpp and reference voltage Vref. Oscillator 220 receives oscillator-on signal osc_on and external power supply voltage VDD and periodically generates a pulse signal osc_p where oscillator-on signal osc_on has logic level "high".

Charge pump 230 receives pulse signal osc_p and external power supply voltage VDD and performs a charge pumping operation to generate boosting voltage Vpp with an amplitude greater than external power supply voltage VDD, or more particularly, with an amplitude greater than the boosting voltage target level. Charge pump 230 feeds back boosting voltage Vpp and applies fed-back boosting voltage Vpp to boosting voltage level detector 210.

Initially, where internal power supply voltage VINT reaches the predetermined internal power supply voltage level target level so that power-up signal /PWRUP transitions from logic level "high" to logic level "low", boosting voltage level detector 210 compares fed-back boosting voltage Vpp with reference voltage Vref output from the reference voltage generator and detects whether boosting voltage Vpp reaches the boosting voltage target level.

Where boosting voltage Vpp is less than the boosting voltage target level, boosting voltage level detector 210 outputs oscillator-on signal osc_on with logic level "high", and oscillator 220 receives oscillator-on signal osc_on with logic level "high" and periodically generates oscillator pulse signal osc_p. On the other hand, where boosting voltage Vpp is greater than or equal to the boosting voltage target level, boosting voltage level detector 210 outputs low-level oscillator-on signal osc on so that oscillator 220 stops operating.

Where oscillator 220 receives oscillator-on signal osc_on with logic level "high" from boosting voltage level detector 210 and periodically generates oscillator pulse signal osc_p, charge pump 230 receives oscillator pulse signal osc_p and performs a charge pumping operation to increase the amplitude of boosting voltage Vpp. Charge pump 230 feeds boosting voltage Vpp back to boosting voltage level detector 210 as fed-back boosting voltage Vpp.

Boosting voltage level detector 210 compares fed-back boosting voltage VPP with reference voltage Vref, detects whether boosting voltage Vpp is greater than or equal to the boosting voltage target level, and controls operation of oscillator 220 based on the result of the comparison.

Oscillator 220 continues to periodically generate oscillator pulse signal osc_p under the control of boosting voltage level detector 210 until the amplitude of boosting voltage Vpp reaches the boosting voltage target level.

Referring to FIG. 5, power-up circuit 300 comprises a differential amplifier circuit 310, a bias voltage supplier 320, an initialization transistor N4, an inverter INV, and a delay circuit 330. Differential amplifier circuit 310 comprises first and second PMOS transistors P1 and P2 and first through third NMOS transistors N1 through N3.

Differential amplifier circuit 310 receives internal power supply voltage VINT and bias voltage VBIAS and outputs a differentially amplified voltage corresponding to a difference between voltages VINT and VBIAS.

In differential amplifier circuit 310, first PMOS transistor P1 has a first terminal connected to internal power source voltage VINT, a second terminal, and a gate connected to the second terminal of first PMOS transistor P1. First NMOS transistor N1 has a first terminal connected to the first terminal of first PMOS transistor P1, a second terminal, and a gate connected to internal power source voltage VINT. Second PMOS transistor P2 has a first terminal connected to internal power source voltage VINT, a second terminal, and a gate connected to the gate of first PMOS transistor P1. Second NMOS transistor N2 has a first terminal connected to the second terminal of second PMOS transistor P2 via a node "A", a second terminal connected to the second terminal of first NMOS transistor N1, and a gate. Third NMOS transistor N3 has a first terminal connected to the respective second terminals of first and second NMOS transistors N1 and N2, a second terminal connected to ground, and a gate.

Bias voltage supplier 320 receives external power source voltage VDD and outputs a bias voltage VBIAS, which is elevated to a high level along with external power supply voltage VDD and then maintained at a constant level after a predetermined time point. Bias voltage is applied to the gate of second NMOS transistor N2 and to a gate of initialization transistor N4. In addition to its gate, initialization transistor N4 has a first terminal connected to node "A" via a node "C", and a second terminal connected to ground. Inverter INV is connected to node "C" and outputs power-up signal /PWRUP. Initialization transistor N4 initializes the output voltage of differential amplifier circuit 310 to logic level "low" at the predetermined time point and transitions power-up signal /PWRUP to logic level "low".

Delay circuit 330 receives an output signal of inverter INV, delays the received signal for a predetermined duration of time, and controls a switching operation of third NMOS transistor N3 of differential amplifier circuit 310 by applying the delayed signal to the gate of third NMOS transistor N3.

Various operations of power-up circuit 300 will now be described in further detail below. As external power supply voltage VDD increases, internal power supply voltage VINT and bias voltage VBIAS tend to increase accordingly. Bias voltage supplier 320 receives external power supply voltage VDD and outputs bias voltage VBIAS, which is maintained at a constant level after a predetermined time point irrespective of an increase in external power supply voltage VDD. Thus, unnecessary power consumption can be prevented and noise can be minimized.

Driving transistor N3 of differential amplifier circuit 310 remains turned on because a relatively high-level voltage is applied to the gate thereof. Therefore, a voltage at node "C" assumes logic level "low" and inverter INV outputs power-up signal /PWRUP with logic level "high", indicating to internal circuits that internal power supply voltage VINT has not yet reached the predetermined internal power supply voltage target level.

Thereafter, where internal power supply voltage VINT reaches a higher level than bias voltage VBIAS, differential amplifier circuit 310 outputs a high-level output voltage, and initialization transistor N4 is turned off so that the voltage apparent at node "C" assumes a high-level. Then, inverter INT outputs power-up signal /PWRUP with logic level "low", and power-up signal /PWRUP is fed back and applied through delay circuit 330 to the gate of driving transistor N3 of differential amplifier circuit 310. Thus, driving transistor N3 is turned off, stopping operation of differential amplifier circuit 310. As a result, the internal circuits are informed that internal power supply voltage IVNT has reached the predetermined internal power supply voltage target level, so that the internal circuits can perform required operations.

Referring to FIG. 6, initial voltage boosting circuit 400 comprises a level shifter 410, an initial voltage booster 420, and an inverter INV1. The construction and functions of level shifter 410 are similar to those of level shifter 10 in the conventional initial voltage boosting circuit of FIG. 1. Accordingly, a lengthy description of level shifter 410 will be omitted to avoid redundancy. However, unlike the conventional initial voltage boosting circuit of FIG. 1, initial voltage booster 420 includes third and fourth PMOS transistors P3 and P4 and a fifth NMOS transistor N5 instead of only one PMOS transistor as in initial voltage booster 20. In addition, power-saving mode enable signal DPEDE is applied to initial voltage booster 420.

Figure 1:
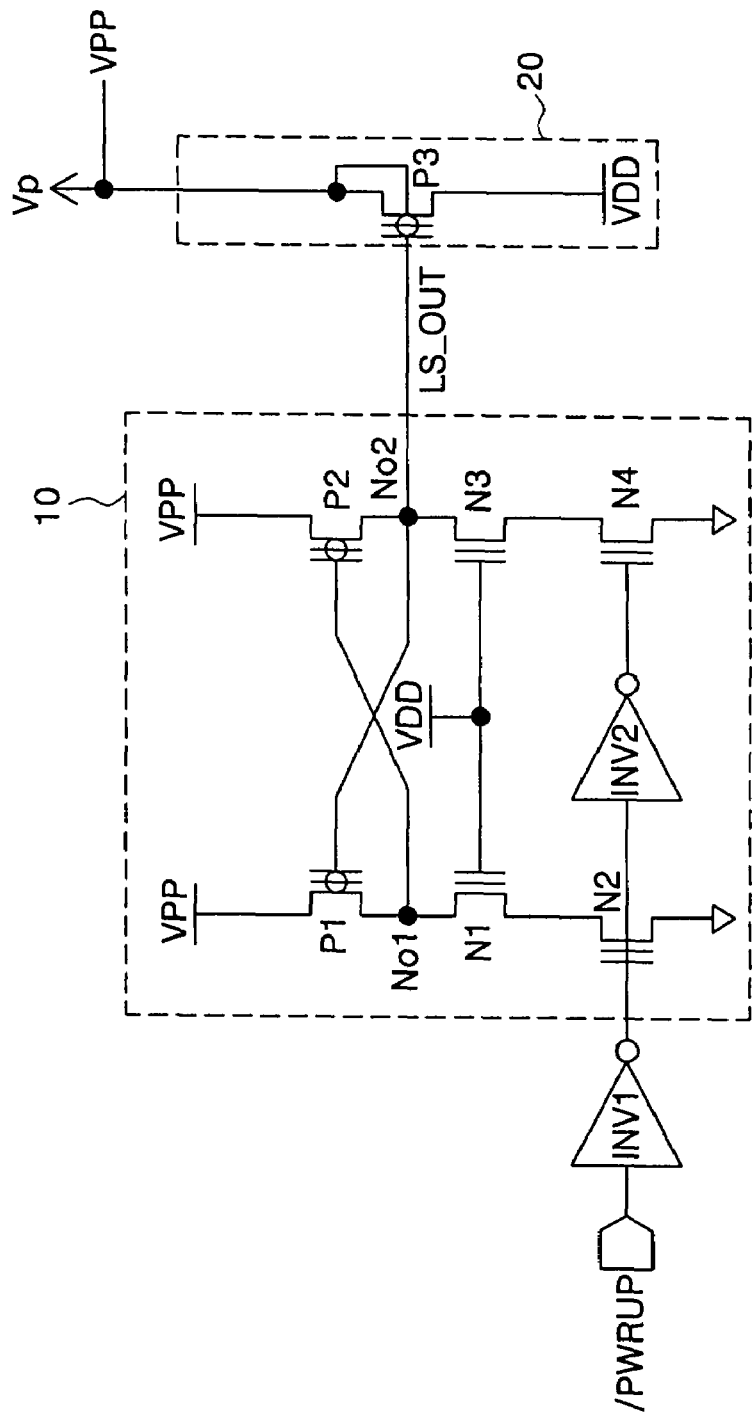
FIG. 1 is a circuit diagram of conventional initial voltage boosting circuit for a semiconductor device.
Figure 2:
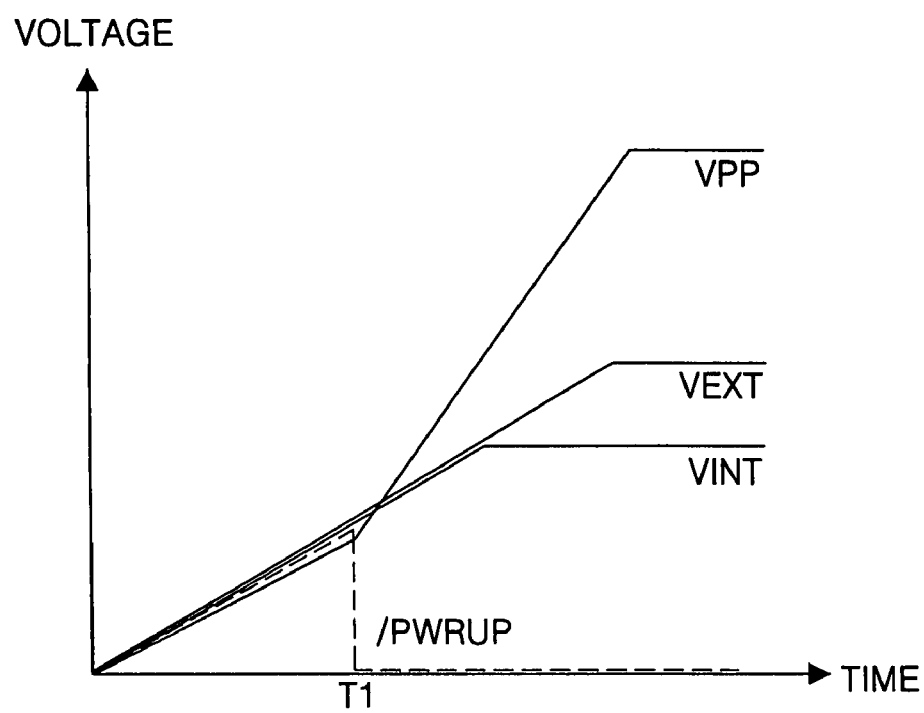
FIG. 2 is a voltage diagram illustrating selected operations of the conventional initial voltage boosting circuit of FIG. 1.

The operation of initial voltage boosting circuit 400 is similar to that of the conventional initial voltage boosting circuit of FIG. 1 in that a boosting voltage Vpp output from voltage boosting circuit 200 is applied to a first terminal and a bulk of third PMOS transistor P3 of initial voltage booster 420 through a voltage boosting terminal VPP, and a level shifter output terminal LS_OUT is connected to a gate of third PMOS transistor P3 of initial voltage booster 420.

However, compared with the conventional initial voltage boosting circuit in which external power supply voltage VDD is applied to the second terminal of third PMOS transistor P3, in initial voltage boosting circuit 400, fifth NMOS transistor N5 has a grounded second terminal, a gate receiving power-saving mode enable signal DPDE, and a first terminal connected to an initial boosting node No3, while fourth PMOS transistor P4 has a first terminal and a bulk receiving external power supply voltage VDD, a second terminal connected to initial boosting node No3, and a gate receiving power-saving mode enable signal DPDE.

The operation of initial voltage booster 420 will now be described in further detail below.

Level shifter 410 receives an inverted power-up signal /PWRUP, increases or decreases inverted power-up signal /PWRUP to a predetermined level, and outputs an output signal on level shifter output terminal LS_OUT based on the logic level of power-up signal /PWRUP.

Initial voltage booster 420 receives the output signal of level shifter 410 and power-saving mode enable signal DPDE and controls connection of external power supply voltage VDD to voltage boosting terminal VPP. Thus, initial voltage booster 420 outputs initial boosting voltage Vp with an amplitude substantially equal to the level of external power supply voltage VDD in a normal mode, and outputs initial boosting voltage Vp with an amplitude less than the level of external power supply voltage VDD in the power-saving mode.

Figure 7:
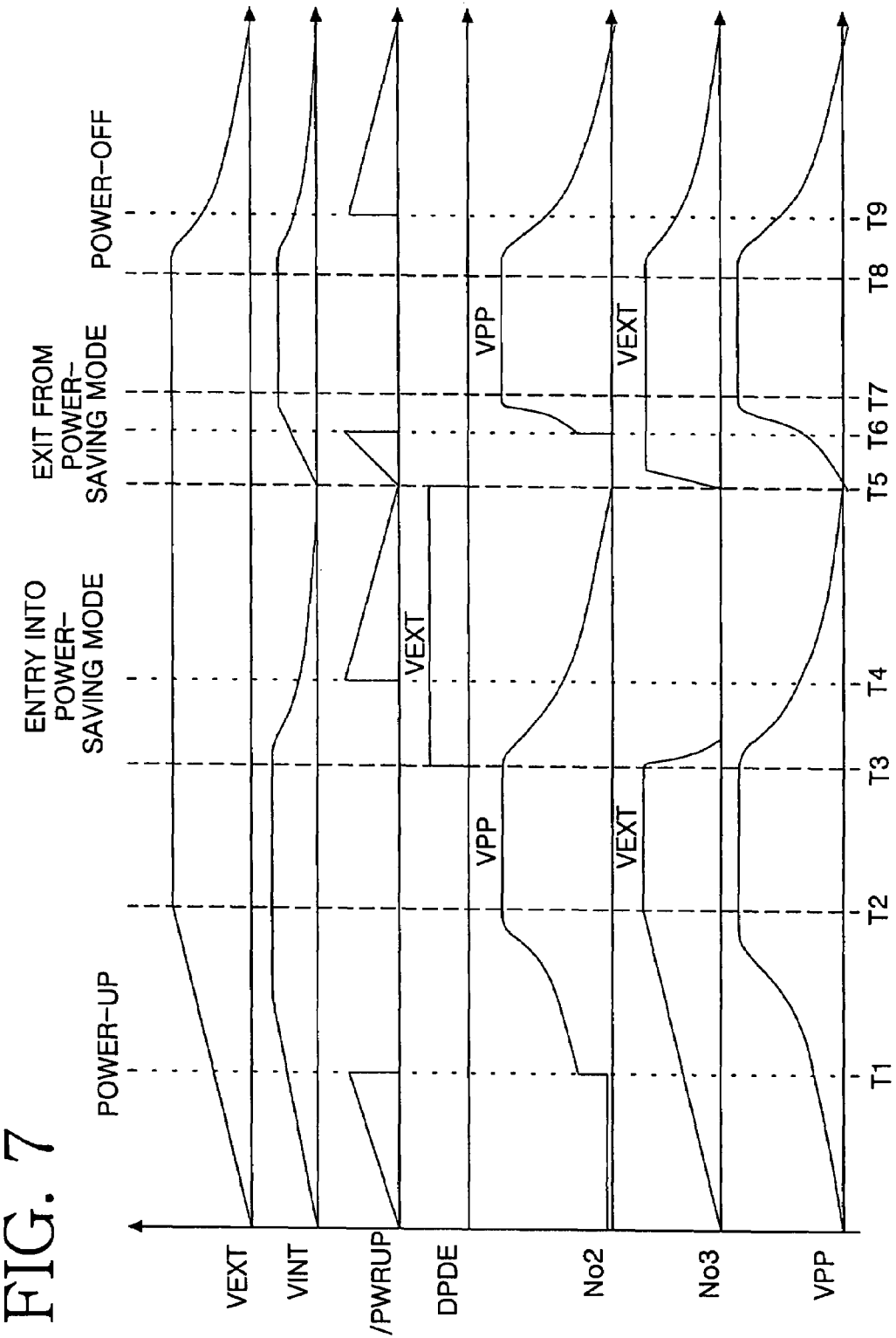
FIG. 7 is a voltage diagram illustrating selected operations of the initial voltage booster of FIG. 6; and, FIG. 8 is a block diagram of a semiconductor memory device including a voltage booster according to an exemplary embodiment of the invention.

FIG. 7 is a voltage diagram illustrating the operation of initial voltage boosting circuit 400 shown in FIG. 6. In FIG. 7, time is represented on the x-axis and voltage is represented on the y-axis. A text label "VEXT" denotes the voltage level of external power supply voltage VDD applied to internal circuits of initial voltage boosting circuit 400 during normal power-on and power-off operations. A text label "VINT" denotes a waveform of internal power supply voltage VINT generated using external power supply voltage VDD and used by the internal circuits of initial voltage boosting circuit 400. A text label "/PWRUP" denotes a waveform of power-up signal /PWRUP used for determining whether internal power supply voltage VINT has reached the predetermined internal power supply voltage target level. A text label "DPDE" denotes a waveform of power-saving mode enable signal DPDE causing the semiconductor device including initial voltage boosting circuit 400 to enter the power-saving mode. A text label "No2" denotes a waveform of a voltage apparent at node No2, a text label "No3" denotes a waveform of a voltage apparent at node No3, and a text label "VPP" denotes a waveform of boosting voltage Vpp generated by initial voltage booster 420.

Referring to FIG. 7, a first period between an initial time point and a time point T1 is a preliminary initial voltage boosting period. During the first period, external power supply voltage VEXT is applied to the internal circuit of semiconductor device at the initial time point, and then external power supply voltage VEXT increases from 0 V to a first target level required for a charge pumping operation.

A second period between time point T1 and a time point T2 is a boosting voltage pumping operation period used to increase the amplitude of boosting voltage Vpp through a charge pumping operation of voltage boosting circuit 200.

A third period between time point T2 and a time point T3 is referred to as a normal operation period. During the third period, the semiconductor device performs operations using boosting voltage Vpp generated by the charge pumping operation.

Fourth and fifth time periods between time points T3 and T4, respectively, and between time points T4 and T5, respectively, are referred to as first and second power-saving mode operation periods, respectively. During the fourth and fifth time periods, power-saving mode enable signal DPDE is enabled to place initial voltage boosting circuit 400 in a power-saving mode until time point T5. Initial voltage boosting circuit 400 enters a power-saving mode at time point T4 in response to internal power supply voltage VINT falling below the predetermined internal power supply voltage target level. Once internal power supply voltage VINT falls below the predetermined internal power supply voltage target level, power-up signal /PWRUP transitions to logic state "high" again. Power-up signal /PWRUP then decreases along with internal power supply voltage VINT to reach ground during the fifth period.

A sixth period between time point T5 and a time point T6 is referred to as a preliminary initial voltage boosting period. During the sixth period, internal power supply voltage VINT rises to the predetermined internal power supply voltage target level so that internal voltage boosting circuit 400 exits the power-saving mode and reenters the normal operation mode at time point T6.

A seventh period between time point T6 and a time point T7 may be referred to as a boosting voltage pumping operation period. During the seventh period, internal power supply voltage VINT increases above the predetermined internal power supply voltage target level and power-up signal /PWRUP decreases to logic level "low".

An eighth period between time point T7 and a time point T8 is referred to as a normal operation period. During the eighth period, the semiconductor device performs internal operations using internal power supply voltage VINT and boosted voltage Vpp generated by the charge pumping operation.

A ninth period between time point T7 and time point T8 is referred to as a power-off period. In the ninth period, external power supply voltage VDD is powered down, as indicated by the lowering of the waveform labeled "VEXT".

Operations of initial voltage boosting circuit 400 will now be described in further detail with reference to FIGS. 6 and 7.

Initial voltage boosting circuit 400 performs similar to the conventional initial voltage boosting circuit illustrated in FIG. 1. For example, where power-up signal /PWRUP has logic level "low", boosting voltage Vpp is output from node No2 connected to level shifter output terminal LS_OUT, and where power-up signal /PWRUP has logic level "high", ground voltage VSS is output at node No2 connected to level shifter output terminal LS_OUT.

However, unlike in the conventional initial voltage boosting circuit, initial voltage boosting circuit responds to power-saving mode enable signal DPDE. Power-saving mode enable signal DPDE is initially applied with logic level "low" during an initial period where the semiconductor device is not in the power-saving mode. Thus, ground voltage VSS is output from level shifter output terminal LS_OUT, so that both third PMOS transistor P3 and fourth PMOS transistor P4 of initial voltage booster 420 are turned on.

Therefore, external power supply voltage VDD is connected to voltage boosting terminal VPP, and thus initial voltage booster 420 generates preliminary initial boosting voltage Vp prior to a charge pumping operation, which results from a rise in external power supply voltage VDD.

Once internal power supply voltage VINT reaches the predetermined internal power supply voltage target level, power-up signal /PWRUP transitions from logic level "high" to logic level "low" and voltage boosting circuit 200 performs the charge pumping operation to increase the amplitude of boosting voltage Vpp to the boosting voltage target level.

Boosting voltage Vpp is applied to level shifter 410 through voltage boosting terminal VPP and transmitted to node No2 connected to level shifter output terminal LS_OUT so that third PMOS transistor P3 of initial voltage booster 420 is turned off. Thus, initial boosting node No3 is maintained at external power supply voltage VDD instead of transmitting boosting voltage VPP to initial boosting node No3.

Where power-saving mode enable signal DPDE has logic level "high" so that the semiconductor device enters the power-saving mode, fourth PMOS transistor P4 of initial voltage booster 420 turns off in response to power-saving mode enable signal DPDE, and fifth NMOS transistor N5 is turned on in response to power-saving mode enable signal DPDE, so that ground voltage VSS is transmitted to initial boosting node No3 during the fourth period. Also, where internal power supply voltage VINT and boosting voltage Vpp start to decrease and internal power supply voltage VINT reaches the predetermined internal power supply voltage target level again, power-up signal /PWRUP transitions from logic level "low" to logic level "high" and then decreases along with internal power supply voltage VINT to ground voltage VSS during the fifth period.

In this case, the bulk of PMOS transistor P4 is connected to external power supply voltage VDD so that a direct current path is not formed between the terminals of fourth PMOS transistor P4 to the bulk thereof. Therefore, a malfunction such as undesirable turning on of PMOS transistor P4 is avoided. As a result, leakage current of the semiconductor device is prevented.

When the semiconductor device exits the power-saving mode, since power-saving mode enable signal DPDE transitions back to logic level "low", fourth PMOS transistor P4 of initial voltage booster 420 is turned on in response to power-saving mode enable signal DPDE and fifth NMOS transistor N5 is turned off in response to power-saving mode enable signal DPDE so that external power supply voltage VDD is transmitted to initial boosting node No3. Thus, the voltage level of initial boosting node No3 rises from ground voltage VSS to external power supply voltage VDD during the sixth period.

As a result, the sixth period of FIG. 4, which corresponds to a preliminary initial voltage boosting period, is similar to the first period illustrated in FIG. 7, and the seventh period, in which internal power supply voltage VINT reaches the predetermined internal power supply voltage target level to allow the charge pumping operation, is similar to the second period. Similarly, the eighth period, is similar to the third period, and the ninth period is similar to the fifth period except that external power supply voltage VEXT is reduced to ground voltage VSS.

Figure 8:
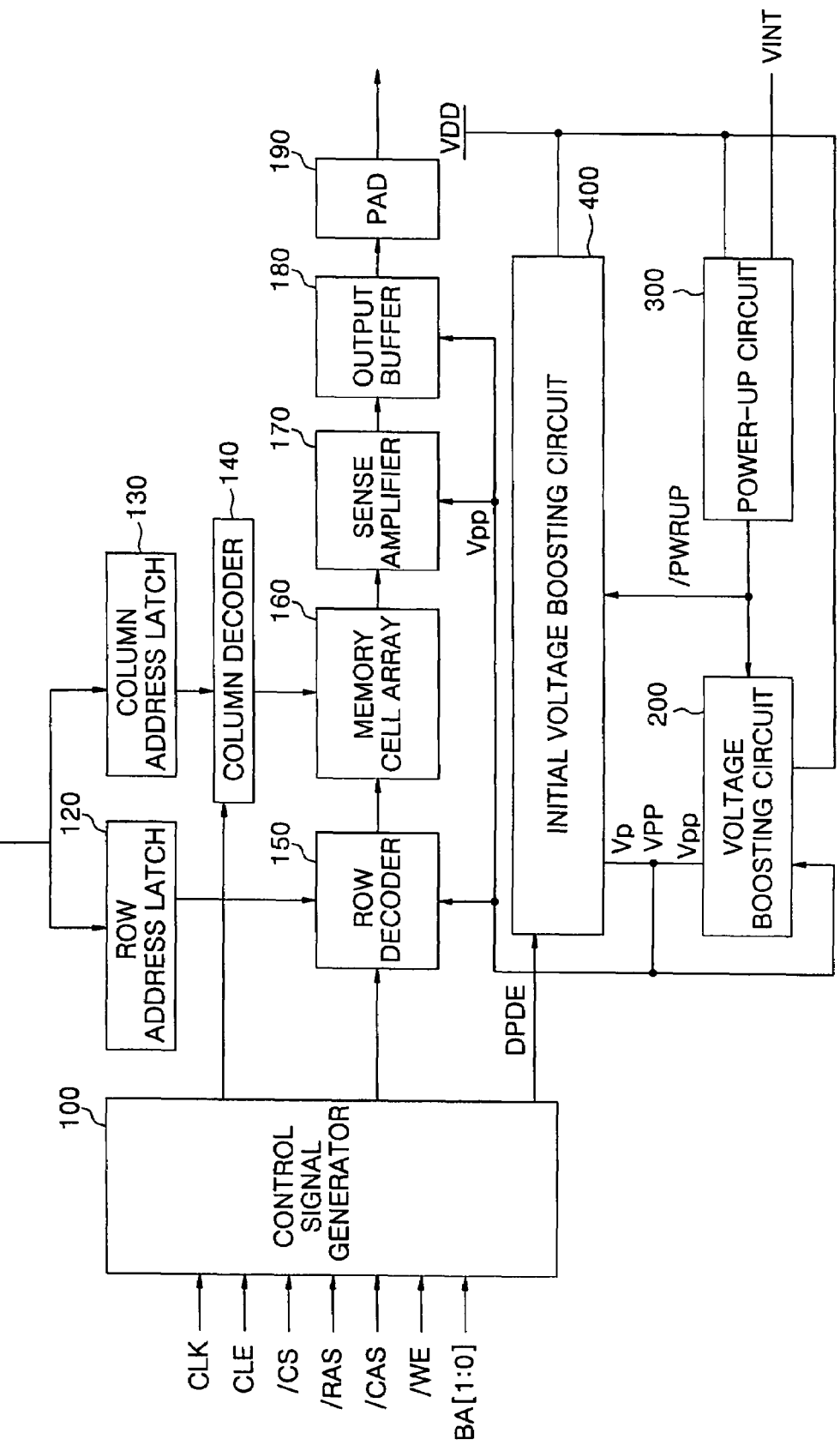

FIG. 8 is a block diagram of a semiconductor memory device including a voltage booster according to an exemplary embodiment of the invention.

Referring to FIG. 8, the semiconductor device comprises a control signal generator 100, a row address latch 120, a column address latch 130, a column decoder 140, a row decoder 150, a memory cell array 160, a sense amplifier 170, an output buffer 180, a pad 190, a voltage boosting circuit 200, a power-up circuit 300, and an initial voltage boosting circuit 400.

Control signal generator 100 receives a plurality of externally applied command signals /CS, /RAS, /CAS, and /WE and generates a power-saving mode enable signal DPDE in response to a combination of one or more of the externally applied command signals. Column address latch 130 and row address latch 120 latch a column address and a row address, respectively, and output corresponding internal addresses based on the column address and the row address. Column decoder 140 and row decoder 150 decode the internal addresses and access a plurality of word lines and a plurality of bit lines based on the internal addresses. Memory cell array 160 writes data in or reads data from a plurality of memory cells connected between the accessed word lines and the bit lines. Sense amplifier 170 amplifies data sensed on the accessed bit lines using boosting voltage Vpp. Output buffer 180 transmits data from the accessed bit lines through pad 190 and out of the semiconductor memory device.

The operation of voltage boosting circuit 200, power-up circuit 300, and initial voltage boosting circuit 400 is similar to the operation of the voltage booster described above in relation to FIG. 3. For example, voltage boosting circuit 200 outputs boosting voltage Vpp, power-up circuit 300 outputs power-up signal /PWRUP, and initial voltage boosting circuit 400 controls a connection between external power supply voltage VDD and voltage boosting terminal VPP. Where the semiconductor device is not in the power-saving mode, initial boosting voltage Vp is output with the voltage level of external power supply voltage VDD. On the other hand, where the semiconductor device is in the power-saving mode, initial boosting voltage Vp is output with a lower level. Because the operation of voltage boosting circuit 200, power-up circuit 300, and initial voltage boosting circuit 400 is similar to the operation of the voltage booster described above in relation to FIG. 3, additional description of these features will be omitted to avoid redundancy.

Row decoder 150, memory cell array 160, sense amplifier 170, and output buffer 180 each receive and use boosting voltage Vpp. For example, row decoder 150 may apply boosting voltage Vpp to word lines of memory cell array 160 to turn on memory cell transistors.

As the internal operating voltages of the semiconductor device in FIG. 8 change (e.g., by decreasing), an output transistor of output buffer 180 may decline in its load driving capability. Since a large current may flow through the output transistor, a latch-up phenomenon, which refers to chip destruction due to overcurrent at an output terminal, may occur. To prevent the latch-up phenomenon, the output transistor of output buffer 180 employs NMOS technology (e.g., a NMOS transistor) instead of complementary metal-oxide semiconductor (CMOS) technology. As a result, where boosting voltage Vpp is applied to a gate of the NMOS transistor, a load can be driven at high speed to a sufficient high-level output voltage.

According to selected embodiments of the invention described above, a voltage booster and a semiconductor memory device including the voltage booster may be included in portable electronic devices requiring a power-saving mode. The voltage booster may control a connection between an external power supply voltage VDD and a voltage boosting terminal VPP using a power-saving mode enable signal DPDE. In addition, the voltage booster may decrease an internal power supply voltage VINT of the semiconductor device using power-saving mode enable signal DPDE. In addition, the voltage booster uses a power-up signal /PWRUP for sensing whether internal power supply voltage VINT reaches a stable target level. By using the voltage booster, the semiconductor device can enter and leave the power-saving mode without significant leakage current.

The foregoing exemplary embodiments are teaching examples. Those of ordinary skill in the art will understand that various changes in form and details may be made to the exemplary embodiments without departing from the scope of the invention as defined by the following claims.

What is claimed:

1. A voltage booster for a semiconductor device having a normal mode and a power-saving mode, the voltage booster comprising:
    a level shifter configured to receive a power-up signal and generate a level shifter output signal in response to the power-up signal, wherein the power-up signal increases along with an internal power supply voltage generated using an external power supply voltage and makes a logical transition when the internal power supply voltage reaches an predetermined internal power supply voltage target level;
    an initial voltage booster configured to transmit the external power supply voltage through an initial boosting node to a voltage boosting terminal in response to the level shifter output signal during the normal mode, and to block transmission of the external power supply voltage to the initial boosting node to decrease a voltage level of the initial boosting node during the power-saving mode; and
    a voltage boosting circuit configured to perform a charge pumping operation in response to the power-up signal to generate a boosting voltage with an amplitude higher than an amplitude of the external power supply voltage during the normal mode and further configured to disable the charge pumping operation during the power-saving mode.

2. The voltage booster of claim 1, wherein the initial voltage booster comprises:
    a first transmission unit configured to turn on in response to the level shifter output signal to transmit a voltage apparent at the initial boosting node to the voltage boosting terminal during the normal mode; and
    a second transmission unit adapted to transmit the external power supply voltage to the initial boosting node during the normal mode and further adapted to decrease the voltage level of the initial boosting node during the power-saving mode in response to a power-saving mode enable signal.

3. the voltage booster of claim 2, wherein the second transmission unit comprises:
    a first transmission gate turned on during the normal mode to transmit the external power supply voltage to the initial boosting node and turned off during the power-saving mode in response to the power-saving mode enable signal to block transmission of the external power supply voltage to the initial boosting node; and
    a second transmission gate connected between the initial boosting node and ground and turned on in response to the power-saving mode enable signal during the power-saving mode to discharge the initial boosting node.

4. The voltage booster of claim 1, wherein the level shifter comprises:

a first positive metal-oxide semiconductor (PMOS) transistor having a first terminal receiving the boosting voltage, a second terminal, and a gate;
a second PMOS transistor having a first terminal receiving the boosting voltage, a second terminal connected to the gate of the first PMOS transistor, and a gate connected to the second terminal of the first PMOS transistor;
a first negative metal-oxide semiconductor (NMOS) transistor having a first terminal connected to the second terminal of the first PMOS transistor, a second terminal, and a gate receiving the external power supply voltage;
a second NMOS transistor having a first terminal connected to the second terminal of the first NMOS transistor, a second terminal connected to ground, and a gate;
a third NMOS transistor having a first terminal connected to the second terminal of the second PMOS transistor, a second terminal, and a gate receiving the external power supply voltage;
a fourth NMOS transistor having a first terminal connected to the second terminal of the third NMOS transistor, a second terminal connected to ground, and a gate; and
an inverter having an input connected to the gate of the second NMOS transistor and having a voltage level controlled in response to the power-up signal, and an output connected to the gate of the fourth NMOS transistor.

5. The voltage booster of claim 1, wherein upon an entry into the power-saving mode, the power-saving mode enable signal transitions to a logic level "high", the internal power supply voltage decreases and then falls below the internal power supply voltage target level and the power-up signal transitions to the logic level "high" in response to the internal power supply voltage falling below the internal power supply voltage target level.

6. The voltage booster of claim 1, wherein upon an exit from the power-saving mode, the power-saving mode enable signal transitions to a logic level "low", and the power-up signal increases along with the internal power supply voltage until the internal power supply voltage rises above the internal power supply voltage target level, upon which, the power-up signal transitions to the logic level "low".

7. The voltage booster of claim 1, wherein where the voltage boosting circuit receives the power-up signal with logic level "low", compares a voltage apparent at the voltage boosting terminal with a reference voltage, and performs a charge pumping operation to increase an amplitude of the voltage apparent at the voltage boosting terminal based on a result of the comparison.

8. A semiconductor memory device having a normal mode and a power-saving mode, the device comprising:
    a power-up circuit configured to output a power-up signal, wherein the power-up signal increases along with an internal power supply voltage generated using an external power supply voltage and makes a logical transition when the internal power supply voltage reaches an internal power supply voltage target level;
    an initial voltage boosting circuit configured to receive the power-up signal and generate a level shifter output signal with a logic level based on a logic level of the power-up signal, transmit the external power supply voltage from an initial boosting node to a voltage boosting terminal in response to the level shifter output signal during a normal mode, and block transmission of the external power supply voltage to the initial boosting node to decrease a voltage level of the initial boosting node during a power-saving mode; and
    a voltage boosting circuit configured to perform a charge pumping operation in response to a logic level of the power-up signal during the normal mode to generate a boosting voltage with an amplitude higher than an amplitude of the external power supply voltage and further configured to disable the charge pumping operation during the power-saving mode.

9. The semiconductor memory device of claim 8, further comprising:

a row decoder configured to receive and decode an internal address and further configured to receive the boosting voltage and apply the boosting voltage to selected word lines of the semiconductor device in accordance with the decoded internal address;

a sense amplifier adapted to receive the boosting voltage and to amplify low voltage signals apparent on selected bit lines of the semiconductor device using the boosting voltage; and an output buffer adapted to receive the boosting voltage and the amplified low voltage signals and to transmit the amplified data out of the semiconductor memory device using the boosting voltage.

10. The semiconductor memory device of claim 8, wherein the power-up circuit comprises:

a bias voltage supplier adapted to receive the external power supply voltage and output a bias voltage at a constant level beginning at a predetermined time point;

a differential amplifier circuit adapted to receive the internal power supply voltage and the bias voltage and output a differentially amplified voltage corresponding to a difference in amplitude between the internal power supply voltage and the bias voltage, wherein the differentially amplified voltage is output on a differential amplifier circuit output terminal;

an initialization transistor having a gate receiving the bias voltage, a first terminal connected to the differential amplifier circuit output terminal, and a second terminal connected to ground, wherein the initialization transistor is used to initialize the differentially amplified voltage to a logic level "low" in response to a transition of the power-up signal from a logic level "high" to logic level "low";

an inverter adapted to receive and invert the differentially amplified voltage to generate the power-up signal; and a delay circuit adapted to receive and delay the power-up signal output by the inverter to control a switching operation of the differential amplifier circuit.

11. The semiconductor memory device of claim 8, wherein the voltage boosting circuit comprises:

a boosting voltage level detector adapted to receive the boosting voltage, compare the boosting voltage with a reference voltage in response to the power-up signal, detect whether the boosting voltage has reached a boosting voltage target level based on the comparison, and output a detection signal with a logic level based on whether the boosting voltage has reached the boosting voltage target level;

an oscillator adapted to receive the detection signal and periodically generate a pulse signal in response to the detection signal; and a charge pump adapted to receive the pulse signal, perform a charge pumping operation in response to the pulse signal, and generate the boosting voltage to feed the boosting voltage back to the boosting voltage level detector until the boosting voltage reaches the boosting voltage target level.

* * * * *